United States Patent [19]
Kim et al.

[11] Patent Number: 6,165,841
[45] Date of Patent: Dec. 26, 2000

[54] METHOD FOR FABRICATING CAPACITORS WITH HEMISPHERICAL GRAINS

[75] Inventors: Dong-Won Kim; Doo-Heun Beak; Jeong-Kon Kim; Sang-Mun Chon, all of Kyonggi-do, Rep. of Korea

[73] Assignee: Samsung Electronics Co., Ltd., Suwon, Rep. of Korea

[21] Appl. No.: 09/289,611

[22] Filed: Apr. 12, 1999

[30] Foreign Application Priority Data

Jun. 9, 1998 [KR] Rep. of Korea ................ 98-21309

[51] Int. Cl.$^7$ .................................................. H01L 21/8242
[52] U.S. Cl. ........................................ 438/255; 438/398
[58] Field of Search ........................... 438/238, 250–256, 438/381, 393–399

[56] References Cited

U.S. PATENT DOCUMENTS

| 5,385,863 | 1/1995 | Tatsumi et al. . |
| 5,663,090 | 9/1997 | Dennison et al. . |
| 5,926,711 | 7/1999 | Woo et al. ........................... 438/260 |

FOREIGN PATENT DOCUMENTS

| 5-55466 | 3/1993 | Japan . |

OTHER PUBLICATIONS

M.C.M. van de Sanden et al., "High–quality a–Si:H grown at high rate using an expanding thermal plasma", Surface and Coatings Technology, vol. 97, pp. 719–722 (1997).

*Primary Examiner*—Jey Tsai
*Attorney, Agent, or Firm*—Jones Volentine, L.L.C.

[57] ABSTRACT

A method for fabricating a semiconductor device, including a lower electrode layer having hemispherical grains, an upper electrode layer, and a dielectric layer interposed between the lower and upper electrode layers. Si-dangling bonds existing on the surface of an amorphous silicon layer dry etched using a lower electrode layer pattern are controlled so that an active migration of silicon atoms from the amorphous silicon layer surface is achieved, so that growth of hemispherical grains on the surface of the amorphous silicon layer is enabled to provide a lower electrode layer with an increased surface area. The amorphous silicon layer is formed with a passivation film of hydrogen thereon which suppresses the growth of natural oxide films and which can be desorbed from that layer at a low temperature during an annealing process carried out in an ultra-high vacuum CVD device for the formation of hemispherical grains. As a result, a large amount of Si-dangling bonds are formed on the surface of the amorphous silicon layer and the migration of silicon atoms is enhanced during the formation of hemispherical grains.

12 Claims, 11 Drawing Sheets

METHOD FOR FABRICATING CAPACITORS WITH HEMISPHERICAL GRAINS

BACKGROUND OF THE INVENTION

1) Field of the Invention

The present invention relates to a method for fabricating semiconductor devices, and more particularly to a method for fabricating capacitors with a structure having hemispherical grains, which is capable of forming a large amount of silicon-dangling bonds while suppressing the growth of a natural oxide film on the surface of a lower electrode layer, thereby achieving an improvement in the growth of hemispherical grains.

2) Description of the Related Art

In a semiconductor memory device, such as a dynamic random access memory (DRAM), including a plurality of memory cells each consisting of one access transistor and one storage capacitor, cell capacitance is important for an improvement in cell memory characteristics in that it serves to improve the read-out ability of the memory device while reducing the soft error rate (SER). However, the recent high integration trend of semiconductor devices inevitably involves a reduction in the cell area per cell, thereby resulting in a reduction in the area occupied by the capacitor. For this reason, it is essentially required to achieve an increase in the capacitance per cell area, in addition to an increase in the integration degree.

Generally, capacitance is proportional to how much area is shared by lower and upper electrode layers. A number of efforts have continuously been made to increase the surface area of the lower electrode layer in a limited space. Most of such efforts are concerned with lower electrode layer structures. By virtue of such efforts, capacitors have been developed from planar capacitor structures, which were initially proposed, to three-dimensional capacitor structures such as those of stacked capacitors or trenched capacitors. However, attempts to increase capacitance by an improved lower electrode layer structure as mentioned above encounter problems such as a limited design rule and complicated fabrication processes.

To this end, proposals have been made to utilize physical properties of the lower electrode layer, thereby achieving an increase in capacitance. Of these proposals, one is disclosed in U.S. Pat. No. 5,385,863, wherein hemispherical grains (HSG) are formed on the surface of a lower electrode layer, thereby increasing the surface area of the lower electrode layer. In accordance with this method, an amorphous silicon layer is formed over a wafer using a low pressure chemical vapor deposition (LPCVD) process. Phosphorous (P) ions are then implanted in the amorphous silicon layer. Subsequently, the surface of the amorphous silicon layer is cleaned, thereby removing a natural oxide film existing thereon. The resulting wafer is then loaded in a chamber defined in an ultra-high vacuum CVD device. The chamber is maintained at an ultra-high vacuum of $10^{-9}$ Torr. In the chamber, the wafer is heated to a desired temperature ranging from 550° C. to 620° C. Under this condition, source gas such as silane ($SiH_4$) or disilane ($Si_2H_6$) is supplied into the chamber, so that crystal nucleuses are formed on the amorphous silicon layer. This technique is generally called a "crystal seeding process". After the formation of the crystal nucleuses, the resulting wafer is subjected to a high vacuum annealing in an $N_2$ atmosphere. By this annealing, silicon atoms migrate from Si-dangling bonds existing on the surface of the amorphous silicon layer to the crystal nucleuses, so that those crystal nucleuses are grown into hemispherical grains. Consequently, the amorphous silicon layer is transformed into a polysilicon layer having an irregular surface.

Generally, Si—Si bond energy in an amorphous silicon layer is 1.58 eV whereas Si—Si bond energy in a single-crystalline silicon layer is 2.4 eV. For this reason, where the growth of hemispherical grains is carried out at a high temperature, a rapid crystallization of amorphous silicon occurs, thereby forming grain boundaries interfering with a migration of silicon atoms. Therefore, the growth temperature of hemispherical grains should be in a range of 550 to 620° C. so that the migration of silicon atoms occurs prior to the crystallization of amorphous silicon.

In accordance with the above-mentioned conventional hemispherical grain formation method, however, a natural oxide film is formed on the surface of the amorphous silicon layer of a wafer when the amorphous silicon layer is exposed to the atmosphere in the process of feeding the wafer to an ultra-high vacuum CVD device after cleaning the wafer. Such a natural oxide film serves to suppress migration of silicon atoms from the surface of the amorphous silicon layer during the growth of hemispherical grains. As a result, the crystal nucleuses on the amorphous silicon layer can not be grown into hemispherical grains.

Meanwhile, in the process of growing hemispherical grains, a large amount of Si-dangling bonds should exist on the surface of the amorphous silicon layer in order to achieve an active migration of silicon atoms to the crystal nucleuses on the amorphous silicon layer. Accordingly, it is necessary to remove Si-dangling bonds existing on the surface of the amorphous silicon layer prior to the formation of hemispherical grains, in order to avoid the formation of natural oxide films on the amorphous silicon layer whereas a large amount of Si-dangling bonds should exist on the surface of the amorphous silicon layer during the process of forming hemispherical grains.

SUMMARY OF THE INVENTION

Therefore, an object of the invention is to provide a method for fabricating capacitors with a structure having hemispherical grains, which is capable of forming a large amount of Si-dangling bonds while suppressing the growth of a natural oxide film on the surface of a lower electrode layer, thereby achieving an improvement in the growth of hemispherical grains.

In accordance with one aspect, the present invention provides a method for fabricating a semiconductor device including a lower electrode layer provided at a surface thereof with hemispherical grains, an upper electrode layer, and a dielectric layer interposed between the lower and upper electrode layers, comprising: dry etching a doped amorphous silicon layer by use of a lower electrode layer pattern; controlling silicon (Si) dangling bonds existing on an exposed surface of the amorphous silicon layer, thereby enhancing migration of silicon atoms from the amorphous silicon layer surface; and growing hemispherical grains over the amorphous silicon layer surface, thereby forming a lower electrode layer.

Preferably, controlling Si-dangling bonds on the surface of the amorphous silicon layer comprises processing the surface of the amorphous silicon layer using hydrogen (H), thereby transforming molecular bonds existing on the surface of the amorphous silicon layer into Si—H bonds.

Preferably, the surface of the amorphous silicon layer is processed in such a fashion that it has a hydrogen concentration of 1E15 atoms/$cm^2$.

Preferably, the step of controlling Si-dangling bonds on the surface of the amorphous silicon layer further comprises bonding Si-dangling bonds, left without being transformed into Si—H bonds, with a material having a bond energy similar to that of the Si—H bonds.

In accordance with another aspect, the present invention provides a method for fabricating a semiconductor device including a lower electrode layer provided at a surface thereof with hemispherical grains, an upper electrode layer, and a dielectric layer interposed between the lower and upper electrode layers, comprising: dry etching a doped amorphous silicon layer by use of a lower electrode layer pattern; processing the surface of the amorphous silicon layer using fluorine (F), thereby transforming molecular bonds existing on the surface of the amorphous silicon layer into Si—F bonds while suppressing a growth of oxide films on the surface of the amorphous silicon layer; processing the surface of the amorphous silicon layer using hydrogen, thereby transforming the Si—F bonds on the surface of the amorphous silicon layer into Si—H bonds; and desorbing hydrogen from the surface of the amorphous silicon layer, and growing hemispherical grains over the amorphous silicon layer surface, thereby forming a lower electrode layer.

In accordance with another aspect, the present invention provides a method for fabricating a semiconductor device including a lower electrode layer provided at a surface thereof with hemispherical grains, an upper electrode layer, and a dielectric layer interposed between the lower and upper electrode layers, comprising the steps of: dry etching a doped amorphous silicon layer by use of a lower electrode layer pattern; carrying out a cleaning process using a hydrofluorine (HF) solution, thereby removing a natural oxide film formed on the surface of the amorphous silicon layer and transforming molecular bonds existing on the amorphous silicon layer surface into Si—F bonds; carrying out a rinsing process using ultra-pure water, thereby transforming the Si—F bonds on the surface of the amorphous silicon layer into Si—H bonds; carrying out a drying process using isopropyl alcohol (IPA), thereby transforming Si-dangling bonds, left without being transformed into Si—H bonds, into Si—$CH_x$ bonds; and desorbing hydrogen and $CH_x$ from the surface of the amorphous silicon layer, and growing hemispherical grains over the amorphous silicon layer surface, thereby forming a lower electrode layer.

Preferably, the method further comprises carrying out a spin drying process, following the drying process using the IPA.

In accordance with still another aspect, the present invention provides a method for fabricating a semiconductor device including a lower electrode layer provided at a surface thereof with hemispherical grains, an upper electrode layer, and a dielectric layer interposed between the lower and upper electrode layers, comprising: dry etching a doped amorphous silicon layer by use of a lower electrode layer pattern; carrying out a cleaning process using a mixture solution of hydrofluorine (HF) and isopropyl alcohol (IPA), thereby removing a natural oxide film formed on the surface of the amorphous silicon layer and transforming molecular bonds existing on the amorphous silicon layer surface into Si—F bonds and Si—$CH_x$ bonds; carrying out a rinsing process using ultra-pure water, thereby transforming the Si—F bonds on the surface of the amorphous silicon layer into Si—H bonds; and desorbing hydrogen and $CH_x$ from the surface of the amorphous silicon layer, and growing hemispherical grains over the amorphous silicon layer surface, thereby forming a lower electrode layer.

Preferably, the method further comprises carrying out a spin drying process, following the drying process using the IPA.

Preferably, the method further comprises, following the rinsing process using the ultra-pure water, carrying out a drying process using IPA, thereby transforming Si-dangling bonds, left without being transformed into Si—H bonds, into Si—$CH_x$ bonds. A spin drying process may also be carried out, following the drying process using the IPA.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Reference will now be made in detail to the preferred embodiments of the present invention.

FIGS. 1 to 4 are cross-sectional views respectively illustrating sequential steps of a method for fabricating a DRAM device in accordance with an embodiment of the present invention.

Figure 1:
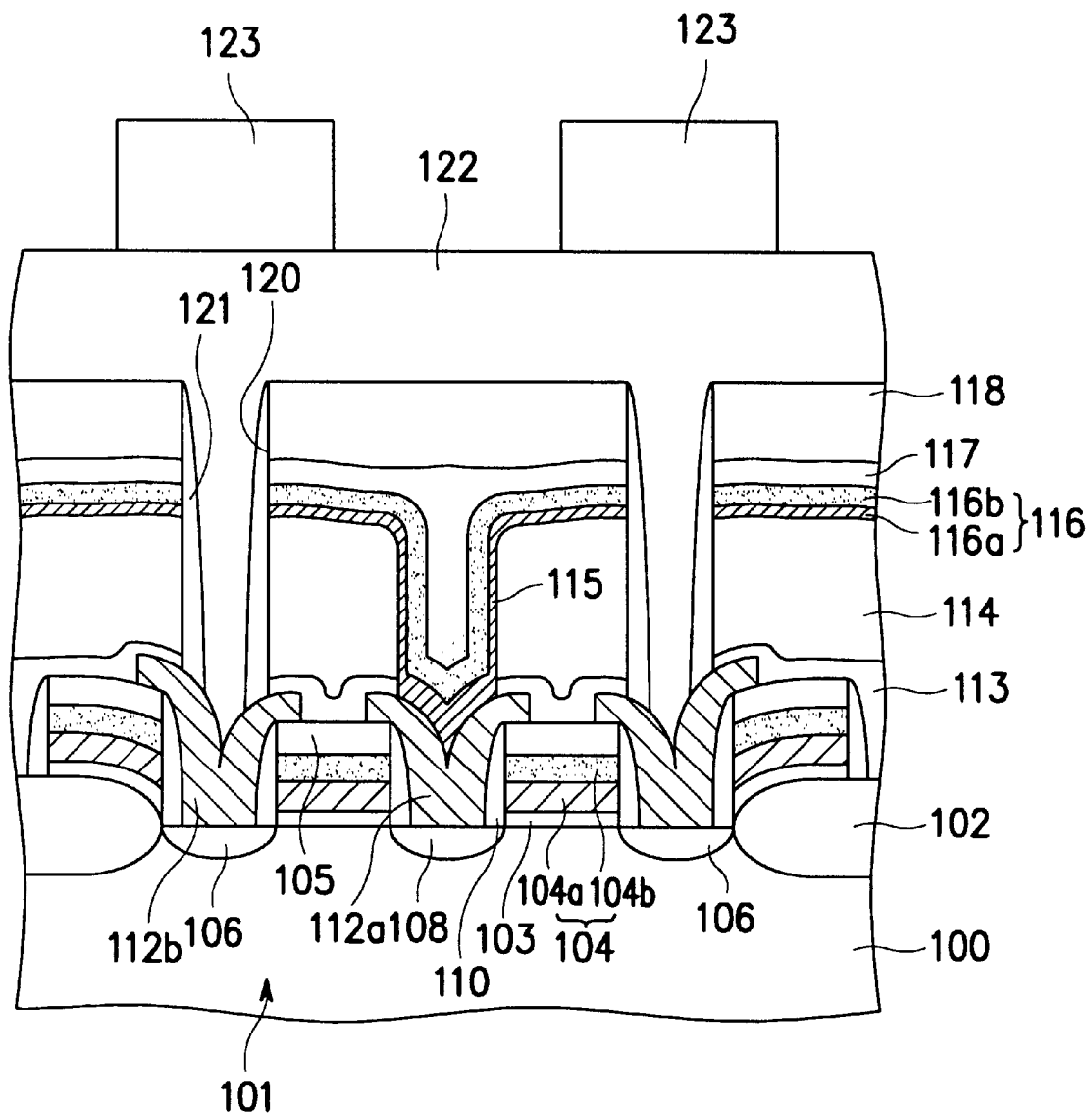
FIGS. 1–2, 3A–3D and 4 are cross-sectional views respectively illustrating sequential steps of a method for fabricating a DRAM device in accordance with an embodiment of the present invention.

FIG. 1 illustrates a processing step for the formation of a doped amorphous silicon layer 122 and a photoresist film pattern 123. As shown in FIG. 1, a P type semiconductor substrate 100 is first prepared. Field oxide films 102 are then formed on the substrate 100 using a well-known device isolation process, for example, a local oxidation of silicon (LOCOS) process or an improved LOCOS process, thereby dividing the substrate 100 into an active region 101 and a device isolation region. Thereafter, the resulting structure is subjected to a dry or wet oxidation process, thereby forming a gate oxide film 103 on a portion of the substrate 100 corresponding to the active region 101. Subsequently, a conductive layer and an insulating layer are sequentially deposited over the resulting structure and then patterned using a photolithography process, thereby forming gate electrodes 104 and gate capping layers 105. Preferably, the gate electrodes 104 are comprised of a polycide layer having a layered structure consisting of a doped polysilicon layer 104a and a metal silicide layer 104b. Using the gate electrodes 104 as an ion implantation mask, N type impurity ions are then implanted in the surfaces of the active region 101, thereby forming source regions 106 and a drain region 108. Thereafter, an insulating film is deposited over the resulting structure and then processed, using a photolithography process, in order to open portions thereof respectively corresponding to memory cell regions. The insulating film is then anisotropically etched at the exposed portions thereof, thereby forming insulating film spacers 110 on the side walls of the gate electrodes 104, respectively. After this etch process, the substrate 100 is exposed at portions thereof respectively corresponding to the source and drain regions 106 and 108.

A conductive layer, which may be, for example, a doped polysilicon layer, is then deposited to a thickness of 3,000 Å or more over the entire upper surface of the resulting structure. This conductive layer is patterned using a photolithography process, thereby forming a first pad electrode layer 112a, which is in contact with the drain region 108, and a second pad electrode layer 112b, which is in contact with each of the source regions 106. Over the resulting structure, an insulating layer 113 and a first interlayer insulating film 114 comprised of, for example, borophosphosilicate glass (BPSG) film, are then sequentially deposited. Subsequently, the first interlayer insulating film 114 and insulating layer 113 are etched, thereby forming a bit line contact hole 115 through which the first pad electrode layer 112a is exposed. Thereafter, a conductive layer is deposited over the resulting structure including the bit line contact hole 115. This conductive layer is patterned using a photolithography process, thereby forming a bit line 116. Preferably, the bit line 116 is comprised of a polycide layer having a layered structure consisting of a doped polysilicon layer 116a and a metal silicide layer 116b.

Over the resulting structure, a second interlayer insulating film 118, which may be comprised of a BPSG film, is then formed. Next, the second interlayer insulating film 118, first interlayer insulating film 114, and insulating layer 113 are etched, thereby forming buried contact holes 120 through which the second pad electrode layers 112b are exposed, respectively. An insulating film, for example, an SiON film, is then deposited over the resulting structure. This insulating film is anisotropically etched, thereby forming contact spacers 121 on the inner walls of the buried contact holes 120.

Thereafter, an amorphous silicon layer 122 doped with an N type dopant, for example, P ions, is deposited to a thickness of about 6,500 Å over the resulting structure, in accordance with an LPCVD method. At this time, the buried contact holes 120 may be filled with the doped amorphous silicon layer 122. Alternatively, the buried contact holes 120 may be filled with a polysilicon layer doped with P ions, prior to the deposition of the amorphous silicon layer 122. Preferably, the amorphous silicon layer 122 is uniformly doped in a concentration of about $1 \times 10^{20}$ atoms/cm$^3$. After the formation of the amorphous silicon layer 122 as mentioned above, a photoresist film is coated over the amorphous silicon layer 122. After carrying out a light exposure and development for the photoresist film, a pattern 123 of the photoresist film is formed which is disposed on a region where the lower electrode layer of a capacitor is to be formed.

Figure 2:
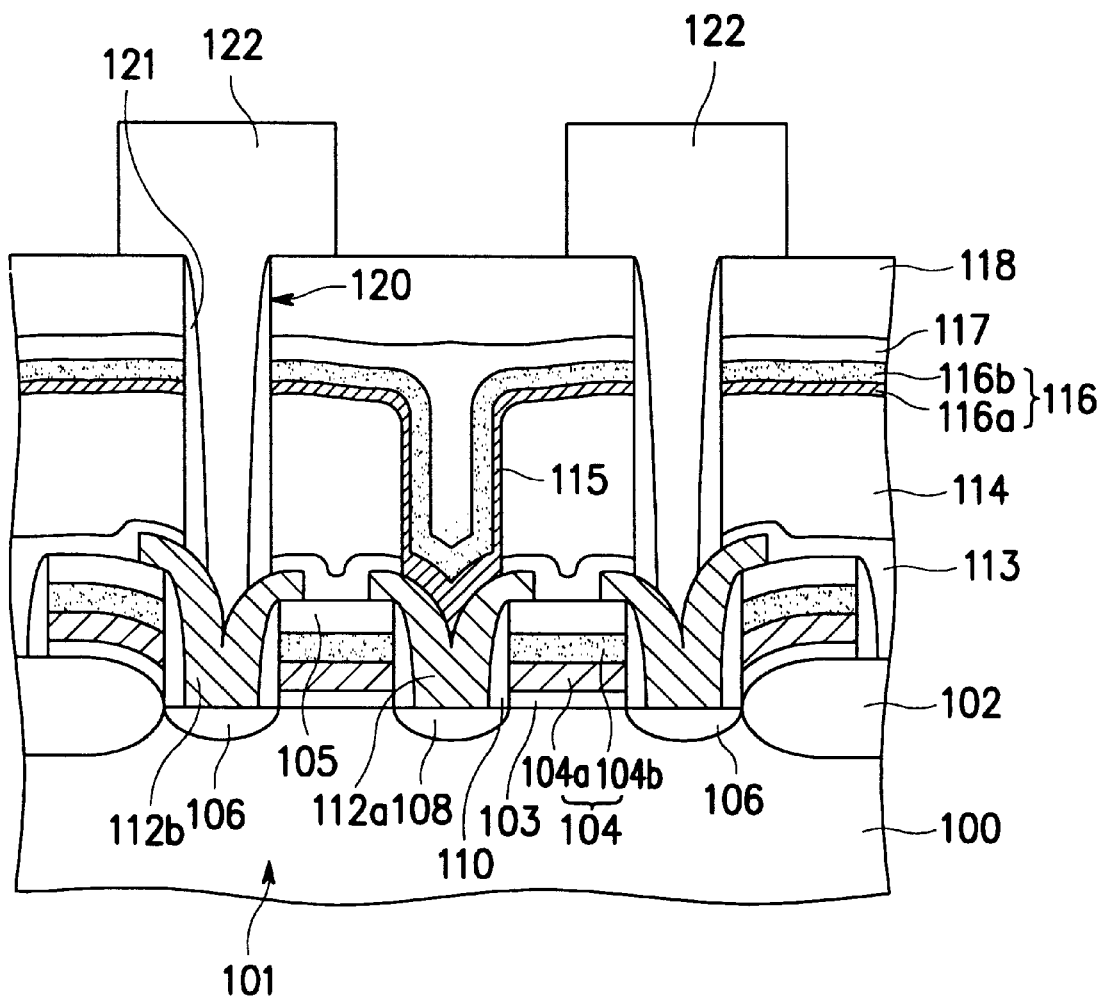

FIG. 2 shows a step of dry etching the amorphous silicon layer 122 using the photoresist film pattern 123 as an etch mask, thereby forming a capacitor lower electrode layer pattern. After the formation of the lower electrode layer pattern, the photoresist film pattern 123 is removed using a plasma ashing and $H_2SO_4$ stripping process.

FIGS. 3a to 3d respectively illustrate processes to which a portion of the surface of the amorphous silicon layer, which is transformed after the dry etching process, is sequentially subjected. These figures are enlarged cross-sectional views respectively illustrating the amorphous silicon layer.

Figure 3A:
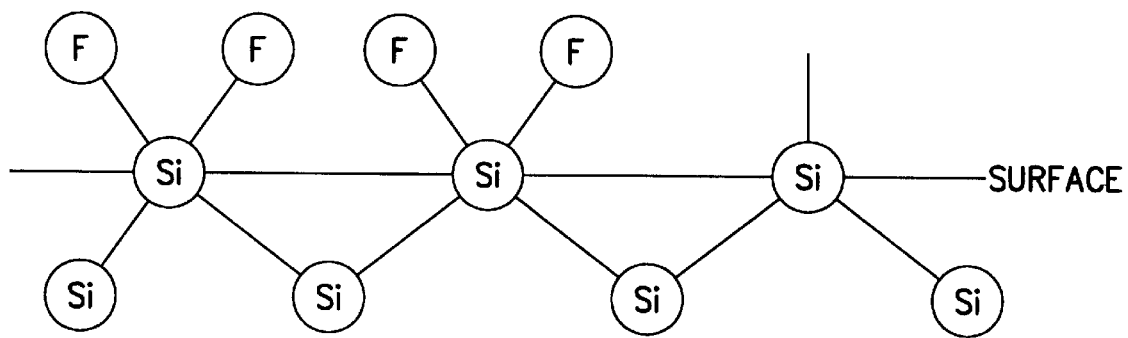

FIG. 3a illustrates a process in which an SC-1 cleaning and an hydrofluorine (HF) cleaning are carried out. In accordance with this process, after the removal of the photoresist film pattern 123 from the wafer, a cleaning is carried out at 70° C. for about 10 minutes using an SC-1, which is a standard cleaning agent, namely, an organic material consisting of $NH_4OH$, $H_2O_2$, and $H_2O$ mixed together in a ratio of 1:4:20, in order to remove particulate, metal impurities, and organic contaminants on the wafer. Thereafter, another cleaning is carried out for about 90 seconds using a diluted solution consisting of HF and ultra-pure water mixed together in a ratio of 1:200, in order to remove a natural oxide film possibly formed on the surface of the amorphous silicon layer 122. By the diluted-HF cleaning process, Si—F bonds are formed on the amorphous silicon layer 122.

Figure 3B:
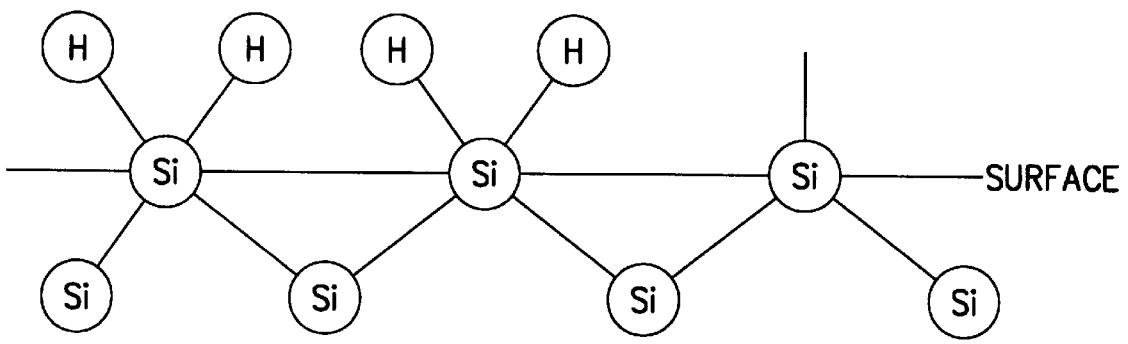

FIG. 3b illustrates a process in which an ultra-pure rinsing is carried out. After completing the diluted-HF cleaning process, a rinsing is carried out for about 210 seconds, in order to remove the diluted solution, namely, HF solution, remaining on the wafer. This rinsing is achieved by dipping the wafer in ultra-pure water. By this ultra-pure rinsing process, fluorine covered over the surface of the amorphous silicon layer 122 is removed. A passivation film of hydrogen is then also formed over the surface of the amorphous silicon layer 122. That is, Si—H bonds such as a dihydride ($SiH_2$) or monohydride (SiH) are formed on the surface of the amorphous silicon layer 122.

Figure 3C:
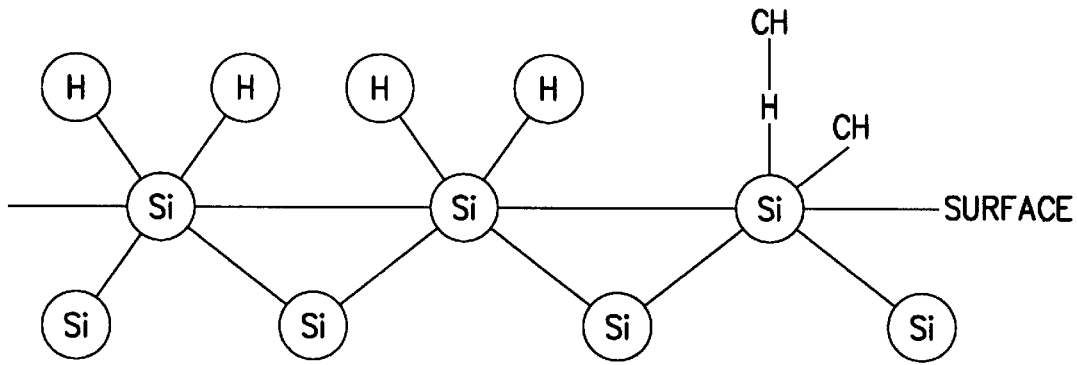

FIG. 3c illustrates a process in which an isopropyl alcohol (IPA) drying is carried out. After completing the ultra-pure rinsing process, a drying is carried out using IPA vapor in order to desorb moisture remaining on the wafer. The IPA vapor is formed by heating IPA at about 200° C. The drying process involves a primary drying step, in which the IPA vapor is condensed on the surface of the wafer and then mixed with the ultra-pure water on the surface of the wafer, so that the mixture is externally discharged as it falls into a receiver included in the equipment, and a secondary drying step, in which a series of successive reactions for desorbing a trace of water molecules remaining on the wafer are carried out. By this IPA drying process, Si-dangling bonds, which are left on the surface of the amorphous silicon layer 122 without being transformed into Si—H bonds, are transformed into Si—$CH_x$ bonds.

Figure 3D:
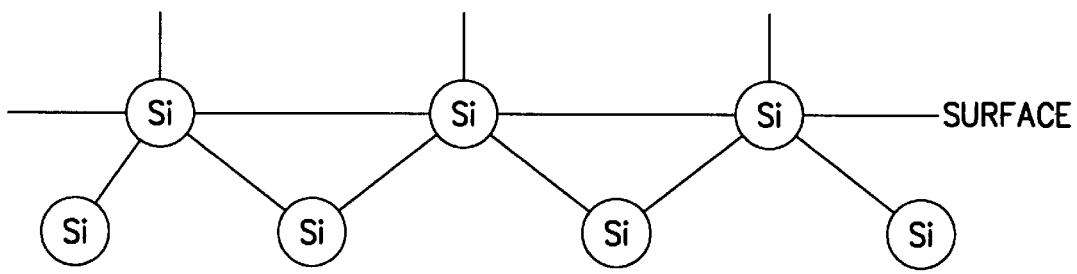

FIG. 3d illustrates a process in which hydrogen and hydrocarbon ($CH_x$) are desorbed from the surface of the amorphous silicon layer 122. After completing the IPA drying process, a quick dry rinsing (QDR) is carried out using a spin drier in order to completely dry moisture left on the wafer by a rotating force of the spin drier. Thereafter, the wafer is loaded in the chamber defined in an ultra-high vacuum CVD device. The chamber is maintained under an ultra-high vacuum of $10^{-9}$ Torr and heated to a desired temperature ranging from 550° C. to 620° C. Accordingly, hydrogen and $CH_x$ adsorbed to the surface of the amorphous silicon layer 122 are desorbed. As a result, a large amount of Si-dangling bonds are formed on the surface of the amorphous silicon layer 122.

Figure 4:
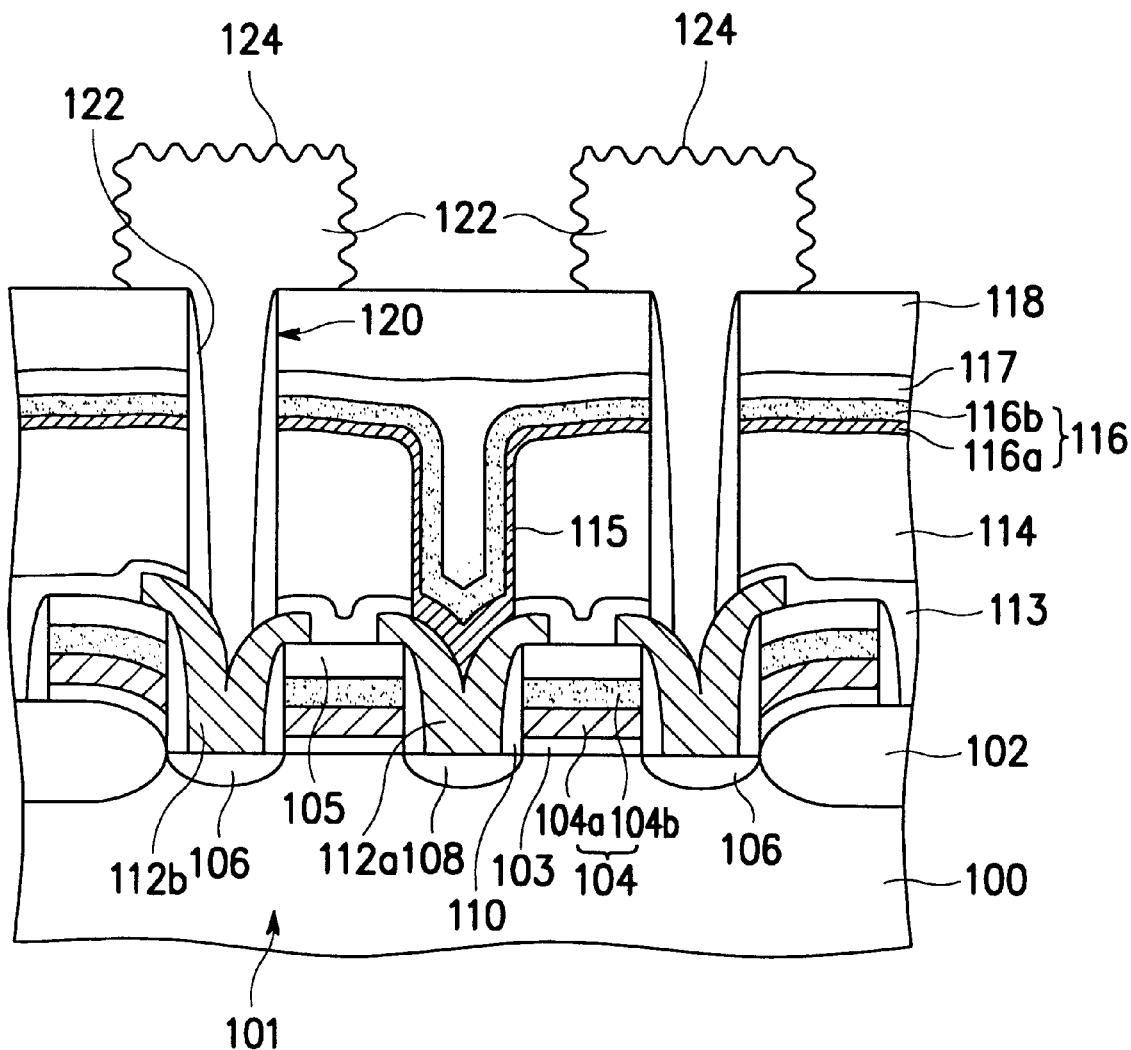

FIG. 4 illustrates a processing step for the formation of hemispherical grains 124. As mentioned above, the well-known crystal seeding process and annealing process are carried out for the surface of the amorphous silicon layer 122, from which hydrogen and $CH_x$ have been desorbed, in order to grow hemispherical grains 124 on that surface. That is, the chamber of the ultra-high vacuum CVD device is first maintained at an ultra-high vacuum of $10^{-9}$ Torr. In this state, the wafer is heated to a desired temperature ranging from 550° C. to 620° C. in the chamber. Under this condition, source gas such as silane ($SiH_4$) or disilane ($Si_2H_6$) is supplied into the chamber, so that crystal nucleuses are formed on the surface of the amorphous silicon layer 122. After the formation of the crystal nucleuses, the resulting wafer is subjected to a high-vacuum annealing in an $N_2$ atmosphere. By this annealing, silicon atoms migrate from the Si-dangling bonds on the surface of the amorphous silicon layer 122 to the crystal nucleuses, so that those crystal nucleuses are grown into hemispherical grains. In accordance with a subsequent annealing process carried out at 800° C., the amorphous silicon layer 122 is finally transformed into a polysilicon layer having the hemispherical grains 124. This polysilicon layer is used as a lower electrode layer.

Although not shown, a dielectric layer having, for example, an ONO (oxide/nitride/oxide) structure is formed on each lower electrode layer 122 having the hemispherical grains 124. Thereafter, a polysilicon layer doped with an N type dopant, for example, P ions, is deposited to a thickness of about 2,000 Å on the dielectric layer 120 using an LPCVD process, thereby forming an upper electrode layer. Thus, storage capacitors are obtained.

Now, the cleaning and drying processes carried out prior to the formation of hemispherical grains in accordance with the present invention will be described in more detail.

First, the SC-1 cleaning process is carried out, thereby removing organic contaminants possibly left on the wafer. After completing the SC-1 cleaning process, the wafer is cleaned using a diluted HF, thereby removing a natural oxide film possibly formed on the surface of the amorphous silicon layer as a lower electrode layer. As the natural oxide film is removed, Si—F bonds are formed on the surface of the amorphous silicon layer. That is, a monolayer of Si—F bonds is formed on the surface of the amorphous silicon layer. The formation of such an Si—F monolayer results in a reduction in the amount of Si-dangling bonds on the surface of the amorphous silicon layer. As a result, the growth of natural oxide films on the amorphous silicon layer is suppressed even when the wafer is exposed to the atmosphere. On the other hand, a reduction in the surface coverage of fluorine on the amorphous silicon layer results in an increased oxidation on the amorphous silicon layer. This is because the Si—F bonds on the surface of the amorphous silicon layer are in a chemically stable state at reaction sites on the surface of the amorphous silicon layer.

TABLE 1

| Bond type | Bond Energy |
| --- | --- |
| Si—F | 129.3 Kcal/mol |
| Si—O | 88.2 Kcal/mol |

TABLE 1-continued

| Bond type | Bond Energy |
| --- | --- |
| Si—H | 70.4 Kcal/mol |
| Si—Si | 42.2 Kcal/mol |

Figure 5:
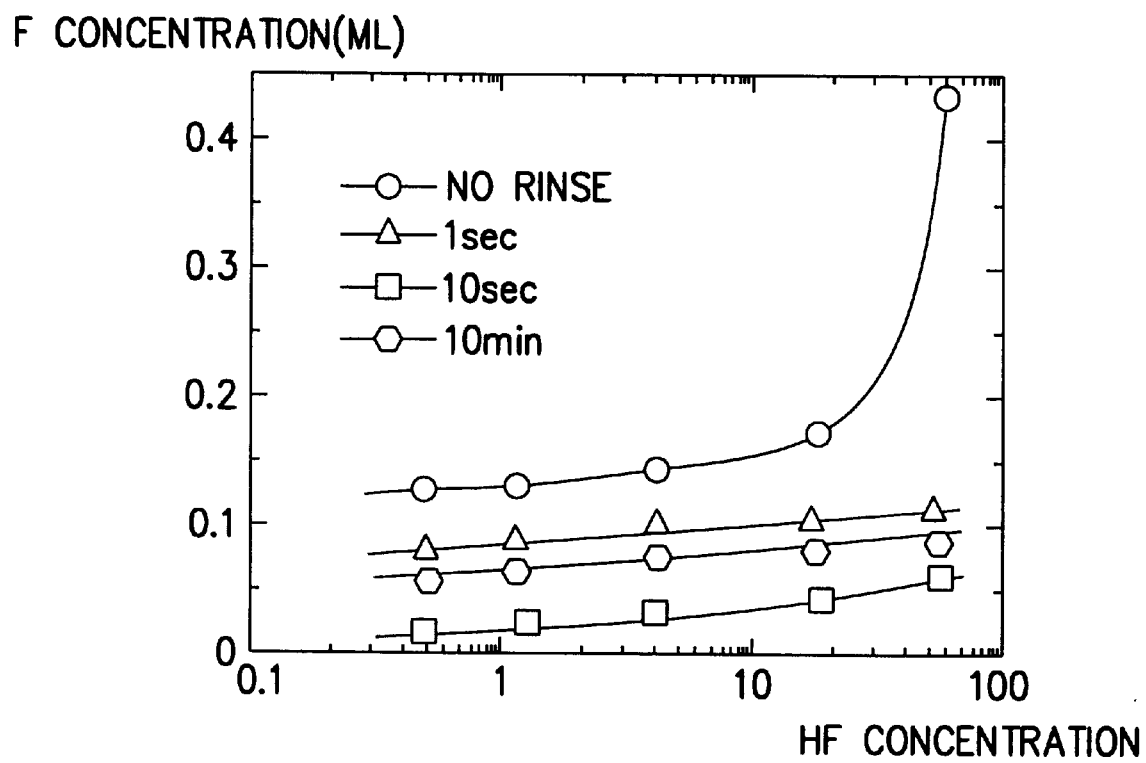
FIG. 5 is a graph depicting a variation in the coverage of fluorine on the surface of a silicon layer depending on the HF concentration and the processing time of an ultra-pure rinsing process.

By experiments, the inventors also found that the thickness of the natural oxide film and the surface coverage of fluorine (F) on the amorphous silicon layer depend on the concentration of the HF solution used, the processing time of the ultra-pure rinsing process, the exposure time to the atmosphere containing nitrogen ($N_2$) and oxygen ($O_2$), and the content of moisture in the source gas used. FIG. 5 is a graph depicting a variation in the coverage of fluorine on the surface of the amorphous silicon layer depending on the concentration of the HF solution and the processing time of the ultra-pure rinsing process.

Referring to FIG. 5, it can be found that an increase in the concentration of the HF solution results in an increase in the coverage of fluorine on the surface of the amorphous silicon layer. For instance, the coverage of fluorine is hardly formed in an HF concentration of 1% or less when the rinsing process is carried out for 10 minutes.

Although Si—F bonds formed on the surface of the amorphous silicon layer serve to suppress the growth of oxide films on that long surface, they interfere with the migration of silicon atoms to the crystal nucleus on the surface of the amorphous silicon layer during the growth of hemispherical grains. This is because the Si—F bonds have bond energy much higher than that of Si—Si bonds. In accordance with the present invention, therefore, the Si—F bonds on the surface of the amorphous silicon layer are transformed into Si—H bonds by carrying out a rinsing process using ultra-pure water for a desired time after the completion of the HF cleaning process, thereby removing fluorine from the surface of the amorphous silicon layer. In other words, Si—H bonds such as $SiH_2$ or SiH are formed on the surface of the amorphous silicon layer.

Figure 6:
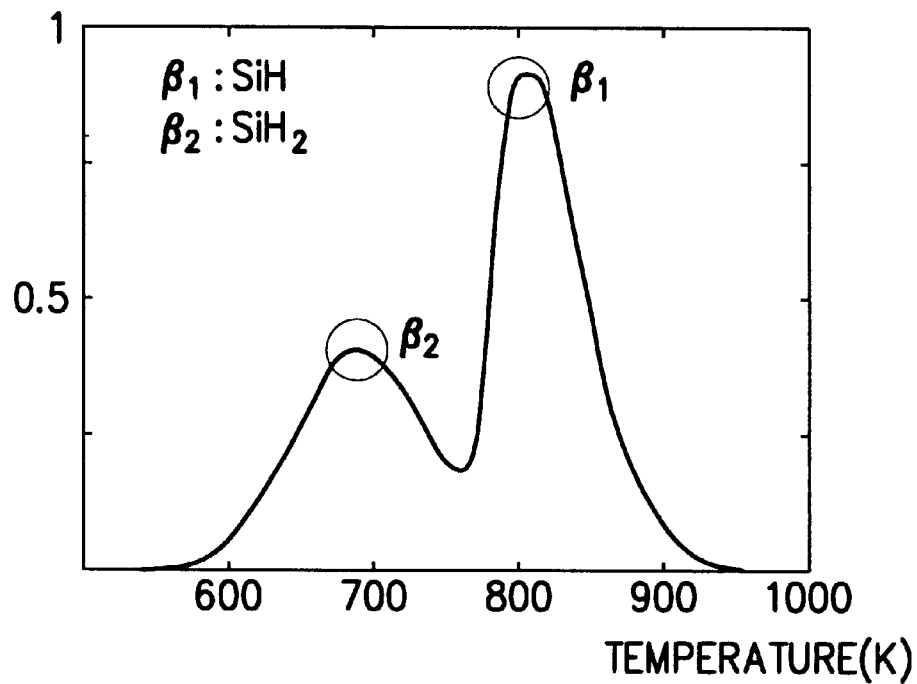
FIG. 6 is a graph depicting the results of a thermal desorption spectroscopy (TDS) analysis to explain a hydrogen desorption by hydrogen desorption oxidation rates.

After an observation of desorption of hydrogen from the surface of a silicon layer using a Fourier transform infrared ray (FTIR) and a thermal desorption spectroscopy (TDS), the inventors also found that desorption of hydrogen from $SiH_2$ occurs when an annealing is carried out at a temperature of 640 to 700 K whereas desorption of hydrogen from SiH occurs when an annealing is carried out at a temperature of 720 to 800 K. FIG. 6 is a graph depicting the results of a TDS analysis to explain a hydrogen desorption by hydrogen desorption oxidation rates. FIG. 6 shows two hydrogen peaks respectively indicative of hydrogen desorption from $SiH_2$ and SiH. In accordance with the method of the present invention, therefore, desorption of hydrogen from the Si—H bonds on the surface of the amorphous silicon layer is easily carried out because the chamber of the ultra-high vacuum CVD device for the formation of hemispherical grains is typically heated to a temperature of 550 to 620° C. Accordingly, a large amount of Si-dangling bonds are formed. By virtue of these dangling bonds, an active migration of silicon atoms to the crystal nucleus on the surface of the amorphous silicon layer is carried out.

Meanwhile, the inventors conducted a measurement of hydrogen adsorption and oxidation rates for the following five samples, in order to inspect variations occurring on the surface of a bare wafer depending on the conditions of the cleaning process carried out prior to the formation of hemispherical grains.

(1) a bare wafer not cleaned;
(2) a wafer subjected to a 200:1 HF cleaning process for 90 seconds, dipped in ultra-pure water for 210 seconds, and then subjected to an SC-1 cleaning process at 70° C. for 600 seconds;
(3) a wafer subjected to a 200:1 HF cleaning process for 90 seconds, dipped in ultra-pure water for 210 seconds, and then subjected to an $H_2SO_4$ boiling process at 120° C. for 600 seconds;
(4) a wafer subjected to an SC-1 cleaning process at 70° C. for 600 seconds, subjected to a 200:1 HF cleaning process for 90 seconds, and then dipped in ultra-pure water for 210 seconds; and
(5) a wafer subjected to an SC-1 cleaning process at 70° C. for 600 seconds, subjected to a 5:1 HF cleaning process for 90 seconds, and then dipped in ultra-pure water for 210 seconds.

Figure 7:
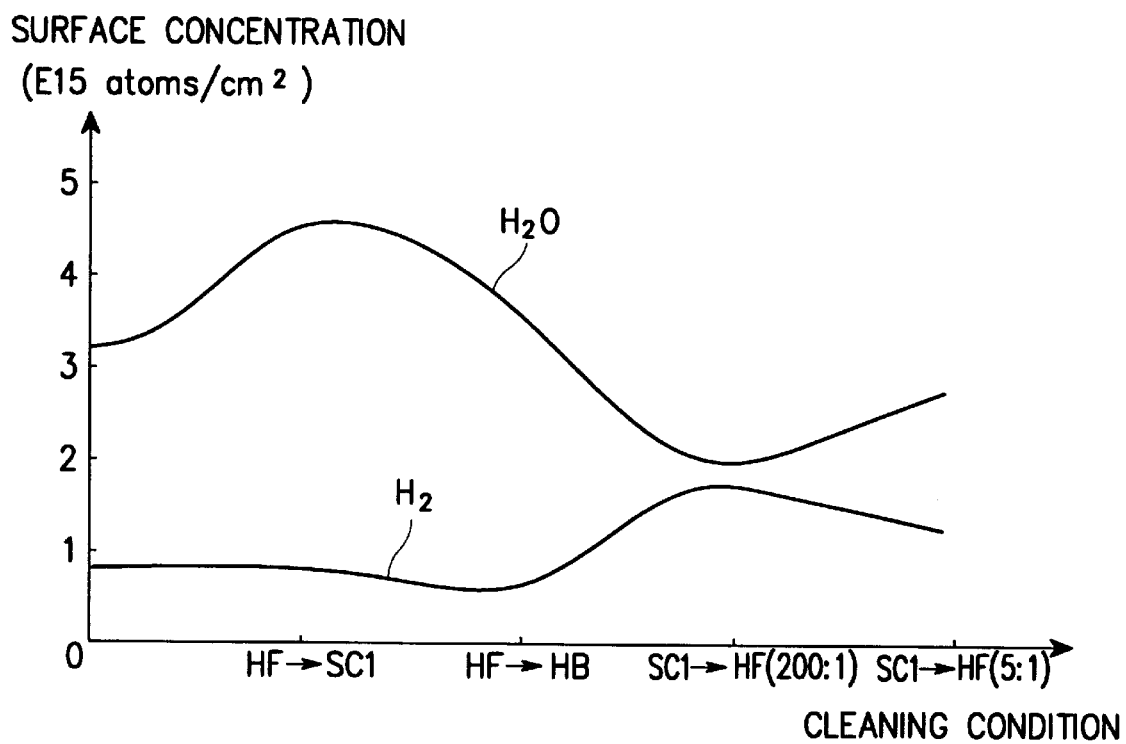
FIG. 7 is a graph for comparing the hydrogen concentration and moisture adsorption on the surface of a silicon layer measured using the TDS method, after completing a cleaning process carried out prior to formation of hemispherical grains.

FIG. 7 is a graph for comparing the hydrogen concentration and moisture ($H_2O$) adsorption on the surface of the silicon layer in each of the samples measured using the TDS method. The measured hydrogen adsorption concentration and moisture adsorption concentration of each sample are described in the following Table 2.

TABLE 2

| | Unit: E15 atoms/$cm^2$ | |
| --- | --- | --- |
| Cleaning Condition | $H_2$ Adsorption Concentration | $H_2O$ Adsorption Concentration |
| (1) Bare Wafer Not Cleaned | 0.839 | 3.39 |
| (2) HF → SC-1 | 0.789 | 4.27 |
| (3) HF → $H_2SO_4$ Boiling | 0.442 | 2.73 |
| (4) SC-1 → HF (200:1) | 1.35 | 1.63 |
| (5) SC-1 → HF (5:1) | 1.07 | 2.32 |

As apparent from FIG. 7 and Table 2, the fourth sample, to which the cleaning process of the present invention was applied, exhibited a highest hydrogen adsorption concentration of 1.35E15 atoms/$cm^2$ and a lowest moisture adsorption concentration of 1.63E15 atoms/$cm_2$, as compared to other samples. From these results, it can be estimated that there is a relation between the moisture adsorption and hydrogen adsorption, and that the surface coated with a passivation film of hydrogen interferes with the growth of an oxide film on that surface. It can also be found from the measured results for the fourth and fifth samples that an increase in HF concentration results in an increase in the area of a region, where a transformation into Si—F bonds occurs on the surface of the silicon layer, thereby preventing an adsorption of hydrogen on the silicon layer in the rinsing process using ultra-pure water. Accordingly, it can be understood that the cleaning process of the present invention, namely, the cleaning process, in which the wafer is subjected to an SC-1 cleaning at 70° C. for 600 seconds, subjected to a 200:1 HF cleaning for 90 seconds, and then dipped in ultra-pure water for 210 seconds, is most suitable to suppress the growth of natural oxide films, thereby enhancing the migration of silicon atoms.

Figure 8:
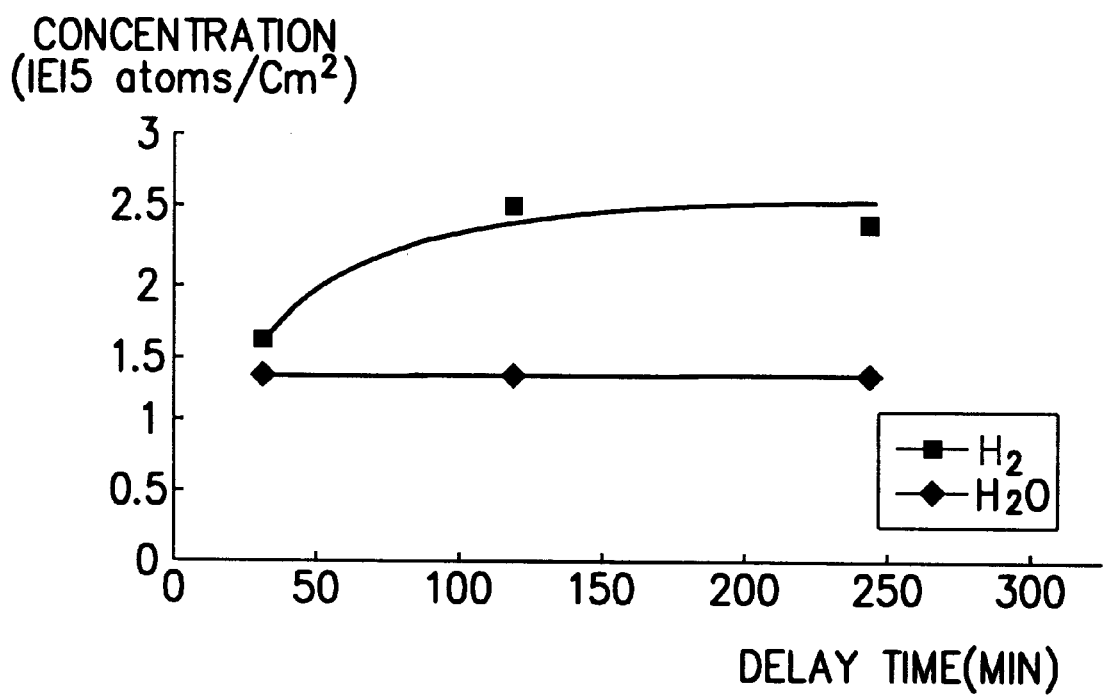
FIG. 8 is a graph for comparing the hydrogen concentration and moisture adsorption on the surface of a silicon layer, measured using the TDS method, depending on a delay time after the completion of a cleaning process.

In order to inspect how the surface of the silicon layer varies depending on the delay time from the completion of the cleaning process, the inventors conducted a comparison between variations in the hydrogen concentration and moisture adsorption on the surface of the silicon layer depending on the delay time from the completion of the cleaning process, in accordance with the TDS method. The results of the comparison are shown in FIG. 8 and Table 3. The cleaning process was carried out under the condition in which the wafer was subjected to an SC-1 cleaning at 70° C. for 600 seconds, subjected to a 200:1 HF cleaning for 90 seconds, and then dipped in ultra-pure water for 210 seconds.

TABLE 3

| | | Unit: E15 atoms/$cm^2$ | |
| --- | --- | --- | --- |
| Condition | Delay Time (Min.) | $H_2$ Concentration | $H_2O$ Concentration |
| Wafer Not Cleaned | 30 | 0.839 | 3.39 |
| Wafer Cleaned | 30 | 1.35 | 1.63 |
| | 120 | 1.37 | 2.42 |
| | 240 | 1.37 | 2.44 |

Referring to FIG. 8 and Table 3, it can be found that the silicon layer of the wafer not subjected to any cleaning process exhibits a hydrogen concentration of 0.83E15 atoms/$cm^2$ on the natural oxide film existing thereon. On the other hand, the silicon layer subjected to the cleaning process of the present invention exhibits a constant hydrogen concentration ranging from 1.3E15 atoms/$cm^2$ to 1.37E15 atoms/$cm^2$ on the surface thereof, independently of the delay time used. However, the moisture adsorption on the surface of the silicon layer increases as the delay time from the completion of the cleaning process increases. This phenomenon will now be described in detail in conjunction with FIG. 9.

Figure 9:
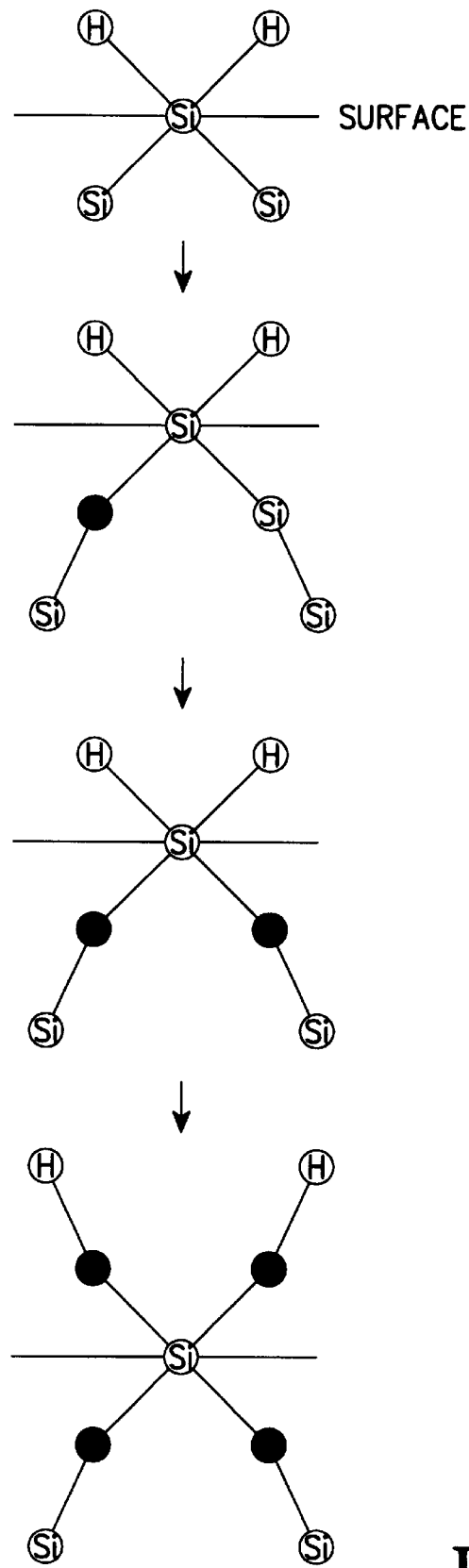
FIG. 9 is a schematic view illustrating the procedure of the growth of a natural oxide film on the surface of a silicon layer under the condition in which the silicon layer is exposed to the atmosphere after the completion of the cleaning process.

FIG. 9 is a schematic view illustrating the procedure of the growth of a natural oxide film on the surface of the silicon layer under the condition in which the silicon layer is exposed to the atmosphere after the completion of the cleaning process carried out prior to the formation of hemispherical grains.

Referring to FIG. 9, Si—H bonds are formed on the surface of the silicon layer when the wafer is subjected to an SC-1 cleaning process at 70° C. for 600 seconds, subjected to a 200:1 HF cleaning process for 90 seconds, and then dipped in an ultra-pure water for 210 seconds. Si—H bonds have bond energy of 70.4 Kcal/mol whereas Si—O bonds and Si—Si bonds have bond energy of 88.2 Kcal/mol and 42.2 Kcal/mol, respectively. Accordingly, when the silicon layer is exposed to the atmosphere after the completion of the cleaning process, oxygen ($O_2$) existing in the atmosphere cuts the Si—Si bonds having a lowest bond energy and, in their place, forms Si—O bonds. As the exposure of the silicon layer to the atmosphere, namely, the delay time, is lengthened, Si—H bonds on the surface of the silicon layer are also transformed into Si—O bonds. As a result, the moisture adsorption on the silicon layer surface increases. Furthermore, more or less Si-dangling bonds not coupled with hydrogen exist on the surface of the silicon layer because the silicon density on the surface of the silicon layer is 1.6E15 atoms/$cm^2$ whereas the hydrogen concentration on the silicon layer surface ranges from 1.3E15 atoms/$cm^2$ to 1.37E15 atoms/$cm^2$. Oxygen is coupled to such Si-dangling bonds during the exposure of the wafer to the atmosphere after the completion of the cleaning process. As a result, an oxide film is undesirably grown.

To this end, in accordance with the present invention, a drying process is carried out using IPA vapor after the completion of the ultra-pure rinsing process, in order to desorb moisture left on the wafer. By this IPA drying process, hydrocarbon ($CH_x$) groups are coupled to Si-dangling bonds existing on the surface of the silicon layer. Accordingly, it is possible to effectively suppress the growth of natural oxide films during the exposure of the wafer to the atmosphere. Generally, desorption of $CH_x$ groups occurs at a temperature substantially equal to that of hydrogen, namely, a temperature of 550 to 620° C. In this regard, when the wafer is loaded in the chamber of an ultra-high vacuum CVD device to form hemispherical grains, hydrogen and $CH_x$ are easily desorbed from the Si—H bonds and Si—$CH_x$ bonds on the surface of the amorphous silicon layer. As a result, a large amount of Si-dangling bonds are formed. As source gas such as silane ($SiH_4$) or disilane ($Si_2H_6$) is supplied into the chamber, crystal nucleuses are formed in the Si-dangling bonds on the surface of the amorphous silicon layer. When the resulting wafer is subjected to a high-vacuum annealing in an $N_2$ atmosphere, silicon atoms migrate from the Si-dangling bonds to the crystal nucleuses.

Figure 10:
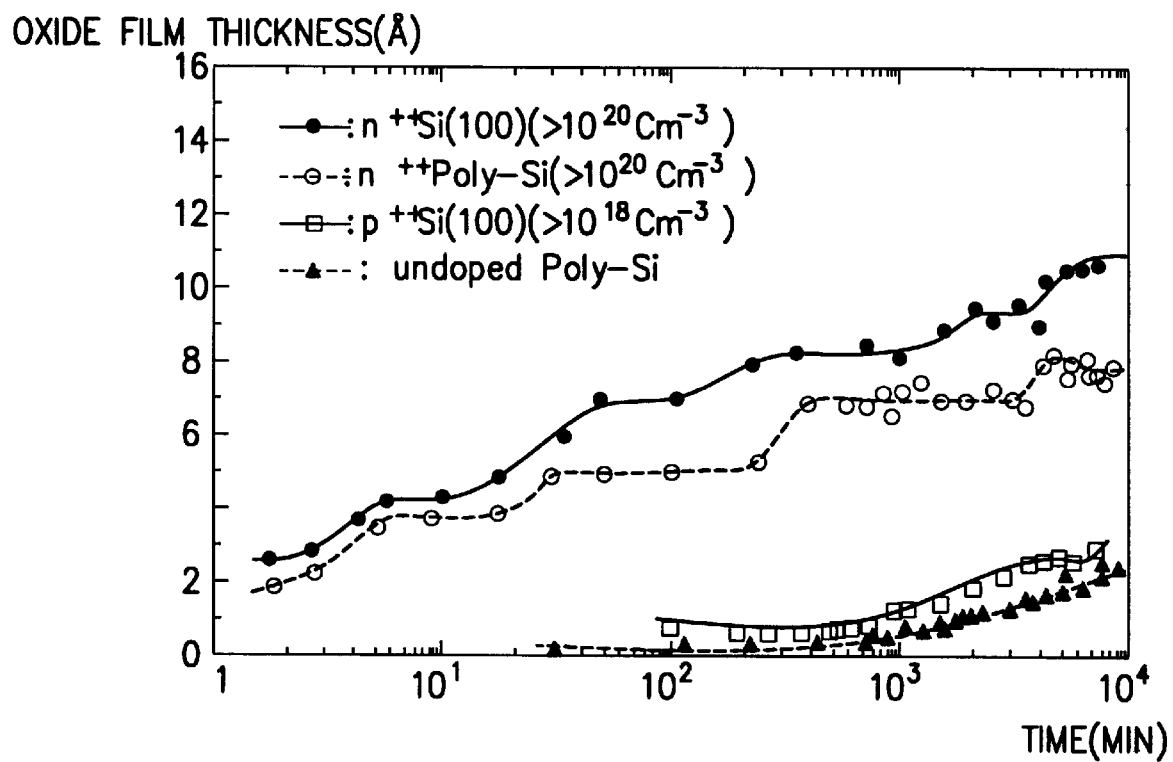
FIG. 10 is a graph depicting the growth of oxide films on respective surfaces of heavily-doped n and p type silicon layers, a heavily-doped n type polysilicon layer, and an undoped polysilicon layer, depending on a delay time for those layers being dipped in ultra-pure water after being cleaned by a 4.5% HF solution.

FIG. 10 is a graph depicting the growth of oxide films on respective surfaces of heavily-doped n and p type silicon layers, a heavily-doped n type polysilicon layer, and an undoped polysilicon layer, depending on a delay time for those layers being dipped in an ultra-pure water after being cleaned by a 4.5% HF solution.

Referring to FIG. 10, it can be found that the heavily-doped p type silicon layer and undoped polysilicon layer exhibit a very low surface oxidation rate whereas the heavily-doped n type silicon layer exhibits a very high surface oxidation rate. That is, oxygen ($O_2$) molecules adsorbed to the surface of the n type silicon layer receive electrons from that surface, so that they are in the form of oxygen ions. These oxygen molecules are decomposed into individual molecules, thereby resulting in an increase in oxidation rate. Accordingly, the heavily-doped n type silicon, which is used for the formation of hemispherical grains, exhibits a higher growth rate of natural oxide films than that in a bare silicon or polysilicon because it has a higher oxidation rate than that of the bare silicon or polysilicon. As shown in FIG. 10, in the case of the heavily-doped n type silicon layer, a natural oxide film is grown to a thickness of about 5 Å over the surface of the silicon layer when an ultra-pure rinsing process is carried out within 10 minutes. This thickness is sufficient to interfere with a migration of silicon atoms occurring during a subsequent formation of hemispherical grains. In order to achieve an active migration of silicon atoms during the formation of hemispherical grains, therefore, it is necessary to completely remove fluorine coated on the surface of the silicon layer by an HF cleaning process, thereby forming Si—H bonds on the silicon layer surface. It is also necessary to carry out an ultra-pure rinsing process for the silicon layer surface for a time desired to suppress the growth of natural oxide films on that surface.

In accordance with another embodiment of the present invention, the HF solution, which is used in the diluted-HF cleaning process, may be used in a mixed state with IPA. In this case, the natural oxide film possibly formed on the surface of the amorphous silicon layer is removed by the functions of the diluted HF and IPA. The molecular bonds on the surface of the amorphous silicon layer are transformed into Si—F bonds and Si—$CH_x$ bonds. Subsequently, a rinsing process using an ultra-pure water is carried out, thereby transforming the Si—F bonds on the surface of the amorphous silicon layer into Si—H bonds. A spin drying process is then carried out. Thereafter, the wafer is loaded in the chamber of the ultra-high vacuum CVD device in which hydrogen and $CH_x$ are, in turn, desorbed from the surface of the amorphous silicon layer. Finally, the growth of hemispherical grains on the surface of the amorphous silicon layer is carried out. Thus, a lower electrode layer is formed.

In order to more effectively suppress the growth of natural oxide films on the surface of the amorphous silicon layer, a further drying process using IPA may be carried out prior to the spin drying process. In this case, Si-dangling bonds left on the surface of the amorphous silicon layer without being transformed into Si—H bonds can be transformed into Si—$CH_x$ bonds.

As is apparent from the above description, in accordance with the present invention, Si-dangling bonds existing on the surface of an amorphous silicon layer dry etched using a lower electrode layer pattern are controlled in such a fashion that an active migration of silicon atoms from the amorphous silicon layer surface is achieved. Accordingly, the growth of hemispherical grains on the surface of the amorphous silicon layer is effectively carried out. Thus, a lower electrode layer with an increased surface area is obtained. In accordance with the present invention, the amorphous silicon layer is formed with a passivation film of hydrogen which can be desorbed from that layer at a low temperature. Accordingly, it is possible to suppress the growth of natural oxide films on the surface of the amorphous silicon layer. The hydrogen is desorbed from the surface of the amorphous silicon layer during an annealing process carried out in the chamber of an ultra-high vacuum CVD device for the formation of hemispherical grains. As a result, a large amount of Si-dangling bonds are formed on the surface of the amorphous silicon layer. By virtue of such Si-dangling bonds, it is possible to enhance the migration of silicon atoms during the formation of hemispherical grains.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A method for fabricating a semiconductor device including a lower electrode layer provided at a surface thereof with hemispherical grains, an upper electrode layer, and a dielectric layer interposed between the lower and upper electrode layers, comprising:

dry etching a doped amorphous silicon layer by use of a lower electrode layer pattern;

processing an exposed surface of the etched amorphous silicon layer using fluorine (F), thereby transforming molecular bonds existing on the exposed surface of the amorphous silicon layer into Si—F bonds while suppressing a growth of oxide films on the exposed surface of the amorphous silicon layer;

processing the exposed surface of the amorphous silicon layer using hydrogen, thereby transforming the Si—F bonds on the exposed surface of the amorphous silicon layer into Si—H bonds; and desorbing hydrogen from the exposed surface of the amorphous silicon layer, and growing hemispherical grains over the desorbed surface of the amorphous silicon layer, thereby forming the lower electrode layer.

2. The method as claimed in claim 1, wherein said processing of the exposed surface of the amorphous silicon layer using hydrogen is carried out so that the exposed surface of the amorphous silicon layer has a hydrogen concentration of 1 E15 atoms/$cm^2$.

3. The method as claimed in claim 1, wherein after Si—F bonds are transformed into Si—H bonds using hydrogen, Si-dangling bonds that have not been transformed into Si—H bonds are bonded with a material having a bond energy similar to that of the Si—H bonds.

4. A method for fabricating a semiconductor device, including a lower electrode layer provided at a surface thereof with hemispherical grains, an upper electrode layer, and a dielectric layer interposed between the lower and upper electrode layers, comprising:

dry etching a doped amorphous silicon layer by use of a lower electrode layer pattern;

carrying out a cleaning process using a hydrofluorine (HF) solution, thereby removing a natural oxide film formed on an exposed surface of the etched amorphous silicon layer and transforming molecular bonds existing on the exposed surface of the amorphous silicon layer into Si—F bonds;

carrying out a rinsing process using ultra-pure water, thereby transforming the Si—F bonds on the exposed surface of the amorphous silicon layer into Si—H bonds;

carrying out a drying process using isopropyl alcohol (IPA), thereby transforming Si-dangling bonds that have not been transformed into Si—H bonds, into Si—CH$_x$ bonds; and desorbing hydrogen and CH$_x$ from the exposed surface of the amorphous silicon layer, and growing hemispherical grains over the desorbed surface of the amorphous silicon layer, thereby forming the lower electrode layer.

5. The method as claimed in claim 4, wherein prior to the cleaning process using the HF solution, a cleaning process is carried out for removing organic contaminants existing on the exposed surface of the etched amorphous silicon layer.

6. The method as claimed in claim 4, wherein the rinsing process using the ultra-pure water is carried out such that the exposed surface of the amorphous silicon layer has a hydrogen concentration of 1E15 atoms/cm$^2$.

7. The method as claimed in claim 4, further comprising carrying out a spin drying process, following the drying process using the IPA.

8. A method for fabricating a semiconductor device, including a lower electrode layer provided at a surface thereof with hemispherical grains, an upper electrode layer, and a dielectric layer interposed between the lower and upper electrode layers, comprising:

dry etching a doped amorphous silicon layer by use of a lower electrode layer pattern;

carrying out a cleaning process using a mixture solution of hydrofluorine (HF) and isopropyl alcohol (IPA), thereby removing a natural oxide film formed on an exposed surface of the etched amorphous silicon layer and transforming molecular bonds existing on the exposed surface of the amorphous silicon layer surface into Si—F bonds and Si—CH$_x$ bonds;

carrying out a rinsing process using ultra-pure water, thereby transforming the Si—F bonds on the exposed surface of the amorphous silicon layer into Si—H bonds; and desorbing hydrogen and CH$_x$ from the exposed surface of the amorphous silicon layer, and growing hemispherical grains over the desorbed surface of the amorphous silicon layer, thereby forming the lower electrode layer.

9. The method as claimed in claim 8, wherein prior to the cleaning process using the HF and IPA solution, a cleaning process is carried out for removing organic contaminants existing on the exposed surface of the amorphous silicon layer.

10. The method as claimed in claim 8, wherein the rinsing process using ultra-pure water is carried out such that the exposed surface of the amorphous silicon layer has a hydrogen concentration of 1E15 atoms/cm$^2$.

11. The method as claimed in claim 8, wherein following the rinsing process using the ultra-pure water, a drying process using IPA is carried out to thereby transform Si-dangling bonds that have not been transformed into Si—H bonds, into Si—CH$_x$ bonds.

12. The method as claimed in claim 11, further comprising carrying out a spin drying process, following the drying process using the IPA.

* * * * *